(12) United States Patent
Duplessis et al.

(10) Patent No.: US 9,704,647 B2
(45) Date of Patent: Jul. 11, 2017

(54) INTEGRATED TRANSFORMER

(71) Applicant: NXP B.V., Eindhoven (NL)

(72) Inventors: Magali Duplessis, Caen (FR); Olivier Tesson, Bretteville l'Orgueilleuse (FR)

(73) Assignee: NXP B.V., Eindhoven (NL)

( * ) Notice: Subject to any disclaimer, the term of this patent is extended or adjusted under 35 U.S.C. 154(b) by 108 days.

(21) Appl. No.: 14/680,699

(22) Filed: Apr. 7, 2015

(65) Prior Publication Data

US 2015/0270061 A1 Sep. 24, 2015

Related U.S. Application Data

(62) Division of application No. 13/101,069, filed on May 4, 2011, now Pat. No. 9,048,021.

(30) Foreign Application Priority Data

May 5, 2010 (EP) .................................... 10290243

(51) Int. Cl.
| | | |
|---|---|---|
| *H01F 5/00* | (2006.01) | |
| *H01F 41/06* | (2016.01) | |
| *H01F 17/00* | (2006.01) | |
| *H01F 27/34* | (2006.01) | |
| *H01F 41/04* | (2006.01) | |
| *H01L 23/522* | (2006.01) | |
| *H01F 27/28* | (2006.01) | |
| *B23K 1/00* | (2006.01) | |
| *B23K 1/20* | (2006.01) | |

(Continued)

(52) U.S. Cl.
CPC .......... *H01F 41/06* (2013.01); *B23K 1/0016* (2013.01); *B23K 1/20* (2013.01); *C23C 14/021* (2013.01); *C23C 14/14* (2013.01); *C25D 3/38* (2013.01); *C25D 5/02* (2013.01); *H01F 5/00* (2013.01); *H01F 17/0006* (2013.01); *H01F 27/2895* (2013.01); *H01F 27/34* (2013.01); *H01F 41/041* (2013.01); *H01L 23/5227* (2013.01); *H01F 2017/0086* (2013.01); *H01L 2924/0002* (2013.01); *Y10T 29/49071* (2015.01)

(58) Field of Classification Search
CPC ................. H01F 5/00; H01F 27/00–27/30
USPC ..................... 336/65, 83, 200, 232
See application file for complete search history.

(56) References Cited

U.S. PATENT DOCUMENTS 5,741,741 A * 4/1998 Tseng ............... H01L 21/76813
257/E21.257
5,759,906 A * 6/1998 Lou ................. H01L 21/76819
257/E21.244

(Continued)

FOREIGN PATENT DOCUMENTS

CN 101047059 B 5/2011
EP 0 778 593 A1 6/1997

OTHER PUBLICATIONS

Long, J. R. "Monolithic Transformers for Silicon RF IC Design", IEEE J. of Solid-State Circuits, vol. 35, No. 9, pp. 1368-1382 (Sep. 2000).

(Continued)

*Primary Examiner* — Tuyen Nguyen (57) ABSTRACT

A transformer comprising primary and secondary windings is disclosed. Each winding has first and second metal capping layers coupled together electrically in parallel by a metal connector passing through a substrate lying between the first and second metal capping layers.

16 Claims, 11 Drawing Sheets

(51) Int. Cl.
  *C23C 14/02* (2006.01)
  *C23C 14/14* (2006.01)
  *C25D 3/38* (2006.01)
  *C25D 5/02* (2006.01)

(56) References Cited

U.S. PATENT DOCUMENTS

| | | | |
|---|---|---|---|
| 5,891,799 A * | 4/1999 | Tsui | H01L 21/31116 |
| | | | 257/E21.252 |
| 5,898,991 A | 5/1999 | Fogel et al. | |
| 5,936,298 A | 8/1999 | Capocelli et al. | |
| 5,949,030 A | 9/1999 | Fasano et al. | |
| 6,002,161 A | 12/1999 | Yamazaki | |
| 6,159,839 A * | 12/2000 | Jeng | H01L 21/76895 |
| | | | 257/E21.507 |
| 6,429,504 B1 | 8/2002 | Beaussart et al. | |
| 6,432,791 B1 * | 8/2002 | Hutter | H01L 27/0629 |
| | | | 257/E27.016 |
| 7,135,951 B1 | 11/2006 | Sidhu et al. | |
| 7,196,607 B2 | 3/2007 | Pleskach et al. | |
| 7,312,685 B1 | 12/2007 | Lee | |
| 2004/0217440 A1 | 11/2004 | Ng et al. | |
| 2005/0073025 A1 | 4/2005 | Hashizume et al. | |
| 2005/0156700 A1 | 7/2005 | Chang | |
| 2007/0017697 A1 | 1/2007 | Hsu | |
| 2007/0032030 A1 | 2/2007 | Coolbaugh et al. | |
| 2008/0079530 A1 | 4/2008 | Weidman | |
| 2008/0100408 A1 | 5/2008 | Chen | |
| 2010/0148866 A1 | 6/2010 | Lee et al. | |
| 2010/0328006 A1 | 12/2010 | Eberson | |
| 2011/0128108 A1 | 6/2011 | Kijima | |

OTHER PUBLICATIONS

Yablonovitch, E. "Photonic Band-Gap Structures", J. Opt. Soc. Am. B, vol. 10, No. 2, pp. 283-295 (Feb. 1993).

Ng, K. T. et al. "Design and Optimization of Monolithic RF Transformers on Silicon", IEEE, Microwave Conference 31st European, 4 pgs. (Aug. 2001).

Extended European Search Report for European Patent Application No. 10290243.4 (Jun. 10, 2010).

* cited by examiner

INTEGRATED TRANSFORMER

CROSS-REFERENCE TO RELATED APPLICATIONS

This application is a division of co-pending application Ser. No. 13/101,069, filed on May 4, 2011, claims the priority under 35 U.S.C. §119 of European patent application no. 10290243.4, filed on May 5, 2010, the contents of which are incorporated by reference herein.

The invention relates to an integrated transformer and to a method for manufacturing such a transformer.

BACKGROUND OF THE INVENTION

The main electrical parameters of a transformer that are of interest to a circuit designer are the transformer turns ratio, n, and the coefficient of magnetic coupling, k. If the magnetic coupling between windings is perfect (i.e. there is no leakage of the magnetic flux) then k is unity. On the other hand, k is zero for totally uncoupled windings. A practical transformer will have a value of k between these two extremes. Typically, for an on-chip monolithic transformer a value of k between 0.75 and 0.9 can be achieved. A higher value of k results in lower losses.

Many topologies have been proposed for on-chip transformers. However, each has its drawbacks. For example, one topology (known as a Shibata or parallel architecture) is easy to design but the total lengths of the primary and secondary windings are not equal. Hence the transformer turns ratio, n, can differ from 1 even if the same number of turns of metal are provided in each winding.

In another topology (known as the Finlay or stacked architecture) a transformer occupying a low area and hence high coupling coefficient, k, can be realised. However, special care must be taken during implementation as the design makes use of both upper and intermediate metal layers. The intermediate metal layers are generally quite thin, leading to higher electrical resistance and thus a high insertion loss. Also, the upper metal layer generally having a lower resistance than the intermediate metal layers creates an asymmetry in the electrical response of the transformer.

Another problem is brought about by the upper winding being electrically shielded from the "conductive" substrate by the lower winding, and hence the parasitic capacitance to the substrate (and the associated dissipation) differs for each winding.

In addition, there is a large parallel plate component to the capacitance between windings due to the overlapping of metal layers, which limits the frequency response.

SUMMARY OF THE INVENTION

In accordance with a first aspect of the invention, there is provided a transformer comprising primary and secondary windings, each winding having first and second metal capping layers coupled together electrically in parallel by a metal connector passing through a substrate lying between the first and second metal capping layers.

Hence, the invention provides a transformer that can be integrated on a substrate, such as a silicon substrate, and in which the windings pass through the substrate. The two windings therefore have a large cross-sectional area, reducing their resistance, and present a large electromagnetic coupling area to each other via the metal connectors passing through the substrate. As a result, the coupling coefficient is very high and the insertion loss low. The transformer is also easy to design, not suffering from the problems inherent with the stacked architecture.

In one embodiment, the substrate is a silicon substrate and each of the first and second metal capping layers lies on top and bottom surfaces of the silicon substrate respectively.

In another embodiment, the substrate is an oxide layer and each of the first and second metal capping layers lies on top and bottom surfaces of the oxide layer respectively.

Thus, in both of these embodiments the first metal capping layer of each winding lies on the top surface of the substrate and the second metal capping layer of each winding lies on the bottom surface of the substrate.

Normally, for each winding, the substrate comprises first and second trenches, and the metal connector comprises first and second parts passing through the first and second trenches respectively, each of the first and second parts coupling the first and second metal capping layers together electrically in parallel.

Alternatively, for each winding, the substrate comprises a first trench, a first part of the metal connector passing through the first trench, the substrate further comprising a common trench through which second parts of the metal connectors for each winding pass electrically isolated from each other, each of the first and second parts coupling the first and second metal capping layers together electrically in parallel.

In one embodiment, the substrate is a first silicon substrate lying between second and third silicon substrates, each of the first and second metal capping layers for the primary winding lying on top and bottom surfaces of the first silicon substrate respectively and each of the first and second metal capping layers for the secondary winding lying on top and bottom surface of the second and third silicon substrates respectively, the metal connector for the primary winding passing through the first silicon substrate and the metal connector for the secondary winding having first and second parts passing in parallel through the first, second and third silicon substrates such that the secondary winding surrounds the primary winding.

Typically, the metal connector for the primary winding has first and second parts passing through first and second trenches in the first substrate respectively, each of the first and second parts coupling the first and second metal capping layers of the primary winding together electrically in parallel.

The first and second parts of the metal connector for the secondary winding normally pass through respective aligned trenches in each of the first, second and third substrates, each of the first and second parts thereby coupling the first and second metal capping layers of the secondary winding together electrically in parallel.

In this embodiment, a second primary winding may also be provided. In this case, first and second metal capping layers for the second primary winding may each lie on top and bottom surfaces of the first silicon substrate respectively, and the metal connector for the second primary winding may pass through the first silicon substrate. Thus, the primary winding and second primary winding lie adjacent each other on the first silicon substrate.

Alternatively, the first and second metal capping layers for the second primary winding may each lie on top and bottom surfaces of a fourth silicon substrate lying between the first silicon substrate and either of the second or third silicon substrates, and the metal connector for the second primary winding may pass through the fourth silicon substrate. In this case, the metal connector for the secondary winding passes through the fourth substrate. Thus, the primary and second primary windings lie one above the other within the secondary winding.

Multiple primary windings may be provided in this way, and the two alternatives of the above two paragraphs may be combined to provide both horizontal and vertical stacking of primary windings.

This embodiment provides a transformer where the secondary winding totally surrounds the primary winding, ensuring excellent electromagnetic coupling between the two.

The surrounding of the primary winding by the secondary winding is also achieved in another embodiment, wherein the substrate is an first oxide layer lying between second and third oxide layers, each of the first and second metal capping layers for the primary winding lying on top and bottom surfaces of the first oxide layer respectively and each of the first and second metal capping layers for the secondary winding lying on top and bottom surface of the second and third oxide layers respectively, the metal connector for the primary winding passing through the first oxide layer and the metal connector for the secondary winding having first and second parts passing in parallel through the first, second and third oxide layers such that the secondary winding surrounds the primary winding.

After manufacturing, the first, second and third oxide layers are not necessarily distinct from each other, but may be one overall oxide layer.

Typically, the metal connector for the primary winding has first and second parts passing through first and second trenches in the first oxide layer respectively, each of the first and second parts coupling the first and second metal capping layers of the primary winding together electrically in parallel.

The first and second parts of the metal connector for the secondary winding normally pass through respective aligned trenches in each of the first, second and third oxide layers, each of the first and second parts thereby coupling the first and second metal capping layers of the secondary winding together electrically in parallel.

In this embodiment, a second primary winding may also be provided. In this case, first and second metal capping layers for the second primary winding may each lie on top and bottom surfaces of the first oxide layer respectively, and the metal connector for the second primary winding may pass through the first oxide layer. Thus, the primary winding and second primary winding lie adjacent each other on the first oxide layer.

Alternatively, the first and second metal capping layers for the second primary winding may each lie on top and bottom surfaces of a fourth oxide layer lying between the first oxide layer and either of the second or third oxide layers, and the metal connector for the second primary winding may pass through the fourth oxide layer. In this case, the metal connector for the secondary winding passes through the fourth oxide layer. Thus, the primary and second primary windings lie one above the other within the secondary winding.

Multiple primary windings may be provided in this way, and the two alternatives of the above two paragraphs may be combined to provide both horizontal and vertical stacking of primary windings.

In accordance with a second aspect of the invention, there is provided a method for manufacturing a transformer comprising primary and secondary windings, the method comprising, for each winding, providing first and second metal capping layers, and coupling the first and second metal capping layers together electrically in parallel by forming a metal connector passing through a substrate lying between the first and second metal capping layers.

Typically, for each winding, the metal connector is formed by making first and second trenches through the substrate and depositing metal within the trenches to form a continuous layer from the top to the bottom surface of the substrate through the trench.

The first and second trenches may be made using an anisotropic etching process.

Alternatively, the first and second trenches may be made using a combination of an anisotropic etching process and grinding the substrate to reduce its thickness.

Typically, the metal is deposited within the trenches using a vapour deposition process or by electrolytic growth.

Normally, the metal capping layers are provided using a vapour deposition process or by electrolytic growth.

In one embodiment, the substrate is a silicon substrate and prior to depositing metal within the trenches and/or providing the metal capping layers, an oxidation step is performed followed by silicon nitride deposition to isolate the metal from the silicon substrate.

Physical vapour deposition of a titanium-copper alloy may be performed to enable the electrolytic growth of copper.

BRIEF DESCRIPTION OF THE DRAWINGS

Examples of the invention will now be described in detail with reference to the accompanying drawings, in which.

DETAILED DESCRIPTION

Figure 1:
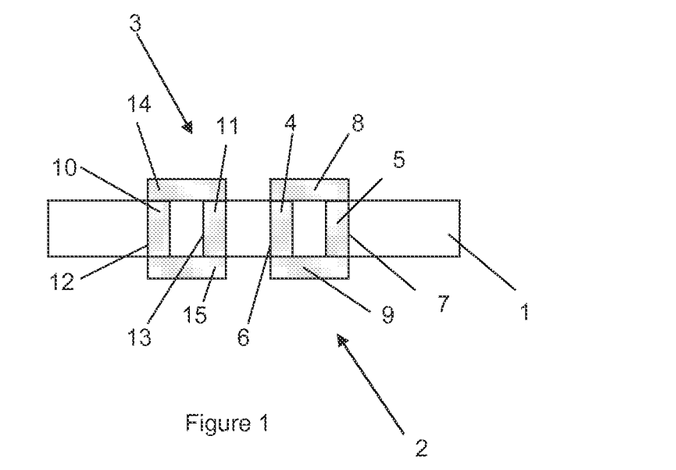
FIG. 1 shows a cross-sectional view through the windings of a transformer in a silicon die.

A cross-sectional view of a transformer manufactured as an integrated circuit on a silicon die 1 is shown in FIG. 1. The transformer comprises a primary winding 2 and a secondary winding 3, both of which are embedded in the silicon die 1.

The primary winding 2 comprises two metal connectors 4, 5 passing through trenches 6, 7 formed in the silicon die 1. Metal capping layers 8, 9 lie on top of silicon die 1 in contact with the two metal connectors 4, 5, which therefore connect the metal capping layers 8, 9 together electrically in parallel.

Similarly, the secondary winding 3 comprises two metal connectors 10, 11 passing through trenches 12, 13 formed in the silicon die 1. Metal capping layers 14, 15 lie on top of silicon die 1 in contact with the two metal connectors 10, 11, which therefore connect the metal capping layers 14, 15 together electrically in parallel.

The metal connectors 4, 5, 10, 11 all fill their respective trenches 6, 7, 12, 13.

This configuration of the windings exhibits a low parasitic capacitive coupling between the primary and secondary windings due to the relatively large distance between the two windings. However, the electromagnetic coupling coefficient, k, is somewhat low for the same reason. Due to the relatively low capacitive coupling, this configuration is well suited to high frequency applications.

Figure 2:
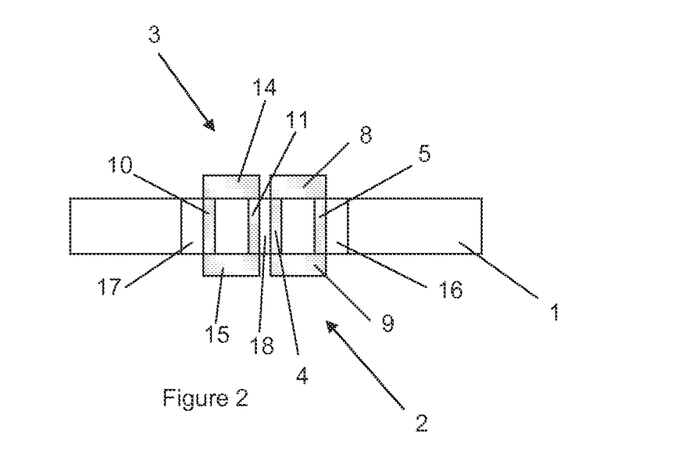
FIG. 2 shows a variation of the layout of the windings of the transformer of FIG. 1.

A second configuration of the layout of the windings is shown in FIG. 2. Parts that are the same or have the same function as in FIG. 1 have been given the same reference numbers. This improves the electromagnetic coupling coefficient, k, significantly. However, this improvement comes at the expense of increasing the parasitic capacitive coupling between the primary and secondary windings. Due to the relatively high capacitive coupling, this configuration is more suited to low frequency applications.

In this second configuration, instead of forming four trenches, only three are formed. Metal connector 5 of the primary winding 2 passes through trench 16 and metal connector 10 of the secondary winding 3 passes through trench 17. However, metal connectors 4 of the primary winding 2 and metal connector 11 of the secondary winding 3 share a common trench 18 through the silicon die 1. Each of the metal connectors 4 and 11 is deposited on a respective side wall of the common trench 18, and the metal connectors 4 and 11 are isolated from each other by the gap between them. Their relative proximity enhances the electromagnetic coupling coefficient, k, between the primary and secondary windings 2, 3.

In order to manufacture a transformer as shown in FIGS. 1 and 2 in a silicon die 1, the following steps are carried out:

1) The silicon is anisotropically etched using the Deep Reactive Ion Etching (DRIE) technique where it is desired to form the trenches 6, 7, 12, 13 or 16, 17, 18. The actual pattern made by these trenches will depend on the desired characteristics of the transformer (e.g. the turns ratio and desired inductances of the primary and secondary windings 2, 3) being made and the presence of any other components on the silicon die 1, which may represent a layout constraint.

2) The anisotropic etching does not continue through the whole thickness of the silicon die 1. Instead, to complete the formation of the trenches 6, 7, 12, 13 or 16, 17, 18, the substrate is ground (typically so that the thickness of the silicon die 1 is in the order of several tenths of a micron) to expose the bottom of the trenches 6, 7, 12, 13 or 16, 17, 18 buried in the silicon die 1. Anisotropic etching is not generally used in isolation because the width of the trenches formed is proportional to their depth. Thus, limiting the duration of the etching allows construction of finer trenches.

3) The silicon die 1 is then oxidised, followed by deposition of silicon nitride deposition where it is desired to deposit metal for the metal connectors and capping layers. This step is carried out in order to isolate the metal (typically copper) from the bulk silicon. Copper diffusion can occur in the silicon otherwise.

4) Physical Vapor Deposition of a titanium-copper alloy is then carried out in the regions where it is desired to deposit metal for the metal connectors and capping layers. This enables growth of a copper metal layer.

5) The copper metal layer is then grown electrolytically in the trenches 6, 7, 12, 13 or 16, 17, 18. Depending on the duration of this step, the trenches 6, 7, 12, 13 or 16, 17, 18 can be either partially filled (leaving only a layer of metal on the side walls as in FIG. 2) or fully filled (as in FIG. 1).

6) The top metal capping layers 8, 14 are then grown electrolytically followed by the bottom metal capping layers 9 15. The wafer only requires rotating between formation of the top and bottom metal capping layers as they will follow the same pattern.

The trenches will not be formed continuously. Instead, they must be interrupted periodically to prevent the structure collapsing.

The formation of metallic trenches in the silicon die 1 in this way leads to an increase in the cross-sectional area of metal available to carry current in the transformer when compared to prior art techniques. Moreover, it has been found that etching trenches in this way provides a high etching rate due the open structure of the trenches. This can be contrasted with the etching of through-silicon vias, which with a high aspect ratio have a very weak etching rate.

Figure 3:
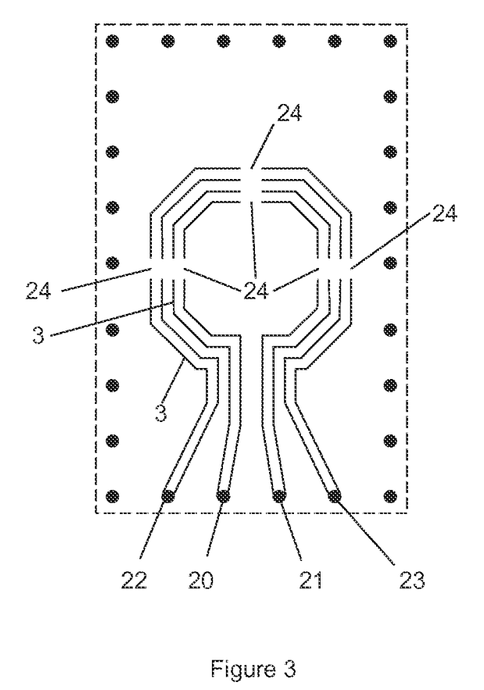
FIG. 3 shows a plan view of a transformer mounted in a package.

FIG. 3 shows a plan view of a transformer similar to that shown in cross-section in FIG. 1. In this the primary 2 and secondary 3 windings can be seen, one within the other. The primary winding 2 terminates at through-silicon vias 20, 21 and the secondary winding 3 terminates at through-silicon vias 22, 23. As can be seen, the trenches in which the primary and secondary windings 2, 3 are formed are interrupted (to prevent collapse as mentioned above) at points 24.

Such a transformer can be packaged and sold as a separate component to be added in a multi-chip module (MCM). The signals are routed through the silicon using through-silicon vias 20, 21, 22 and 23, from which they can be connected to a PCB with solder bumps.

The through-silicon vias and the trenches can be made with the same process flow so the transformer can be manufactured and connected to the PCB without increasing the cost.

Figure 4A:
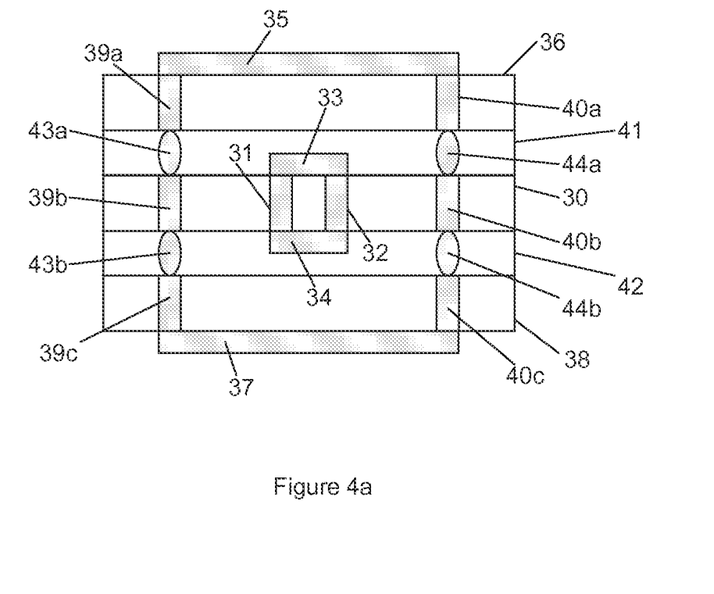
FIGS. 4a-4c show cross-sectional views through a concentric transformer in a silicon die.
Figure 4B:
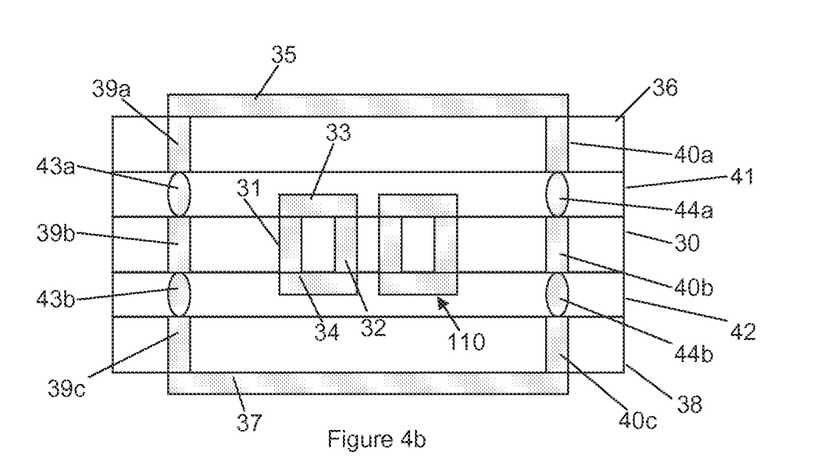
Figure 4C:
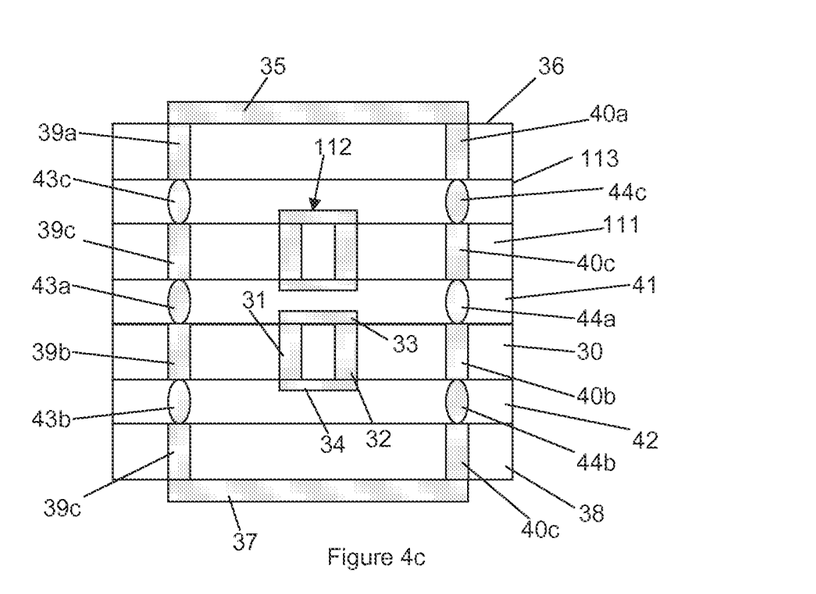

A variation on the transformers shown in FIGS. 1 and 2 is the concentric transformer shown in FIGS. 4a-4c. Here the primary winding is formed inside the secondary winding.

The primary winding is formed in a middle silicon die 30, in which metal connectors 31 and 32 pass through trenches in middle silicon die 30 to electrically couple together metal capping layers 33 and 34.

The secondary winding has a top metal capping layer 35 on the top surface of an upper silicon die 36 and a bottom metal capping layer 37 on the bottom surface of a lower silicon die 38. These are joined by a pair of metal connectors running through all three silicon dice 30, 36, 38. The first metal connector thus runs through a trench 39a in upper silicon die 36, a trench 39b in middle silicon die 30 and a trench 39c in lower silicon die 38. Similarly, the second metal connector runs through a trench 40a in upper silicon die 36, a trench 40b in middle silicon die 30 and a trench 40c in lower silicon die 38.

The silicon dice 30, 36, 38 are separated by plastic spacers 41, 42. Electrical continuity of the metal connectors is ensured by interconnects, known as bumps, 43a, b and 44a, b.

This transformer can be manufactured using the same process as described above to form the pattern of trenches, metal capping layer and metal connectors shown in FIG. 4a.

FIGS. 4b and 4c show two variants on the transformer of FIG. 4a, which may be used to achieve different turns ratios. In each case, an additional primary winding (in parallel with the original primary winding) is formed within the secondary winding.

In FIG. 4b, two primary windings are stacked horizontally next to each other. The first primary winding is formed as explained above with reference to FIG. 4a and as denoted by the metal connectors 31, 32 and metal capping layers 33, 34. The second primary winding 110 is formed in the same way by making trenches in middle silicon die 30 (at the same time as trenches for the metal connectors 31, 32) and filling them with metal and providing metal capping layers, again in the same way and at the same time as metal capping layers 33, 34. The second primary winding 110 has the same structure as the first primary winding although the individual metal capping layers and metal connectors are not separately denoted.

In the variant of FIG. 4c, two primary windings are stacked vertically, one above the other. The first primary winding is formed as explained above with reference to FIG. 4a and as denoted by the metal connectors 31, 32 and metal capping layers 33, 34. The second primary winding 112 is formed in the same way, but in this case it is formed in a further silicon die 111, which is processed in the same way as silicon die 30. Thus, the second primary winding 112 is formed in the same way as the first by making trenches in the further silicon die 111 and filling them with metal and providing metal capping layers. The second primary winding 112 has the same structure as the first primary winding although the individual metal capping layers and metal connectors are not separately denoted. The further silicon die 111 lies above the plastic separator 41 and is separated from the top silicon die 36 by another plastic separator 113. Again, bump interconnects 43c, 44c are provided in the plastic separator 113 along with metal connectors 39c, 40c in silicon die 111 to connect the metal capping layers 35, 37 together.

Providing two primary windings within the secondary winding in this way gives a turns ratio of 2:1 (primary: secondary). Different turns ratios may be provided by forming a different number of primary windings (for example, 3 or more) within the secondary. A combination of vertically and horizontally stacked primaries may be used, for example to achieve 4 primary windings with two windings on the silicon die 30 and two on the further silicon die 111.

Of these two variants, the structure shown in FIG. 4a is best suited to use with silicon substrates (i.e. the type of processing shown and described with reference to FIG. 1) because the horizontal distance between the windings can be kept smaller than the thickness of a bump interconnect. Thus, the electromagnetic coupling coefficient is optimised with the FIG. 4a variant.

FIGS. 5a to 5f shows another way of making a transformer according to the invention, this time using a BiCMOS process such as the QuBIC process. In this case, the deep trenches between metallisation layers can be realised in the dielectric layers using the Deep Trench Isolation (DTI) principle.

Figure 5A:
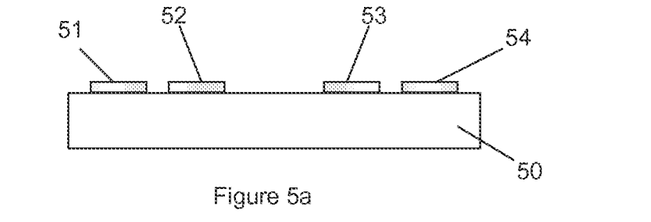
FIGS. 5a-5f show the process steps for manufacturing a transformer in an oxide layer during a BiCMOS process.

In FIG. 5a, copper is deposited and then etched on a silicon die 50 to obtain the bottom metal capping layers 51, 52, 53, 54 for each of the primary and secondary windings.

Figure 5B:
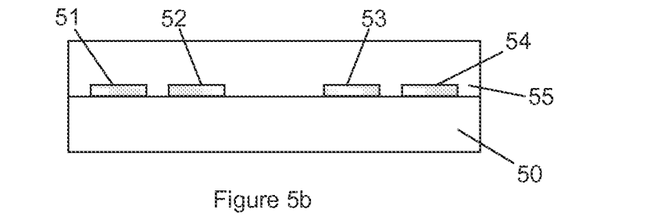

An oxide layer 55 is then deposited above the silicon die 50 and the bottom metal capping layers 51, 52, 53, 54 in FIG. 5b. Chemical mechanical polishing (CMP) of the oxide layer 55 is then carried out for planarisation.

Figure 5C:
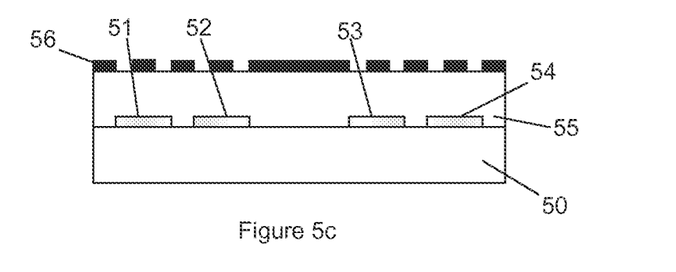
Figure 5D:
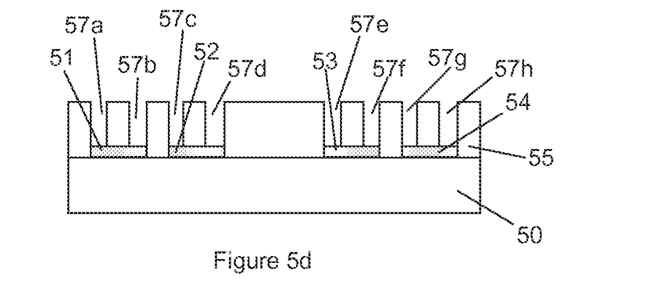

In FIG. 5c, a photoresist layer 56 is deposited to leave the pattern of the trenches required exposed for etching.

Anisotropic etching is then performed to form the trenches 57a to 57h and the photoresist layer 56 is subsequently removed. The trenches 57a to 57h can be seen in FIG. 5d.

Figure 5E:
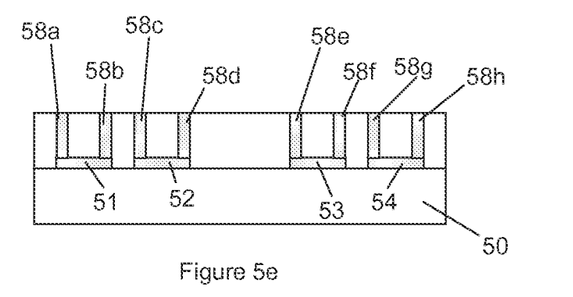

Copper metal is then used to fill the trenches 57a to 57h, which is achieved by chemical vapour deposition (CVD). This forms the metal connectors 58a to 58h, as seen in FIG. 5e. This is followed by a chemical mechanical polishing step for planarisation of the oxide layer 55 with metal connectors 58a to 58h embedded within.

Figure 5F:
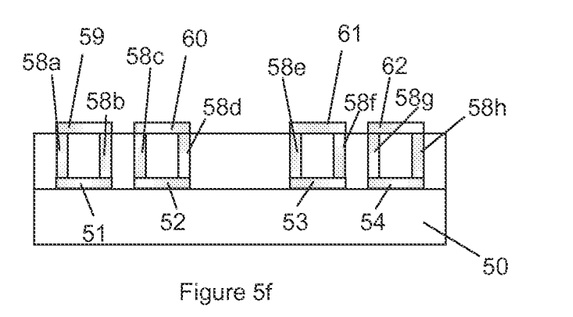

Copper is then deposited above the oxide layer 55 to form the top metal capping layers 59, 60, 61, 62 in FIG. 5f, which shows the finished transformer. As can be seen, the primary and secondary windings are formed in a similar layout to the embodiment of FIG. 1.

Figure 6A:
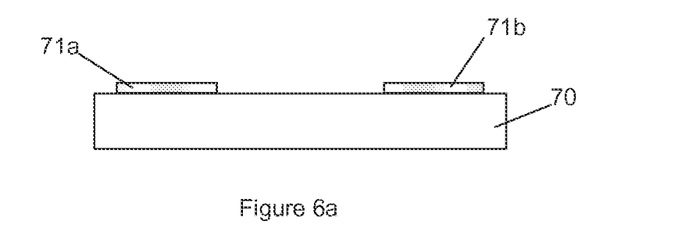
FIGS. 6a-6m show the process steps for manufacturing a concentric transformer in an oxide layer during a BiCMOS process.

A similar process can be used to form a transformer like that of FIG. 4. This process is shown in FIGS. 6a to 6m. Firstly, in FIG. 6a copper is deposited and then etched on a silicon die 70 to obtain the bottom metal capping layers 71a, 71b for the outer secondary winding.

Figure 6B:
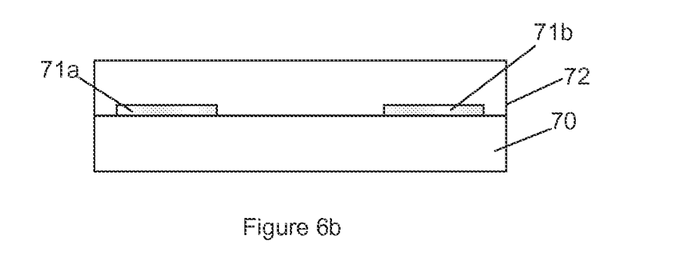

An oxide layer 72 is then deposited above the silicon die 70 and the bottom metal capping layers 71a, 71b of the secondary winding in FIG. 6b. Chemical mechanical polishing (CMP) of the oxide layer 72 is then carried out for planarisation.

Figure 6C:
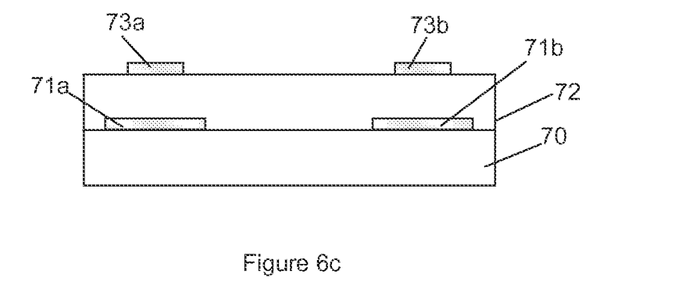

Copper is deposited and then etched on the oxide layer 72 to obtain the bottom metal capping layers 73a, 73b for the primary winding. This is shown in FIG. 6c.

Figure 6D:
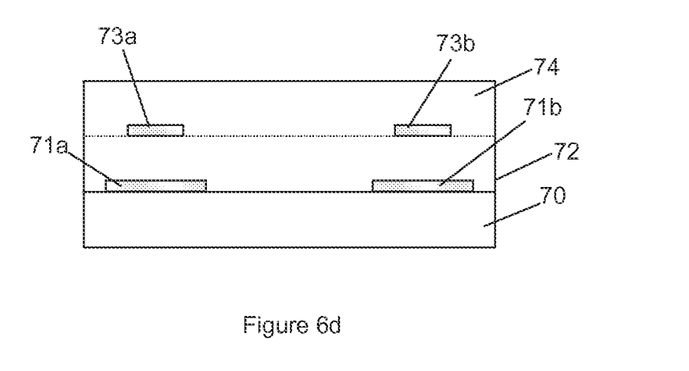

A second oxide layer 74 is then deposited above the oxide layer 72 and the bottom metal capping layers 73a, 73b of the primary winding in FIG. 6d. Chemical mechanical polishing (CMP) of the oxide layer 74 is then carried out for planarisation.

Figure 6E:
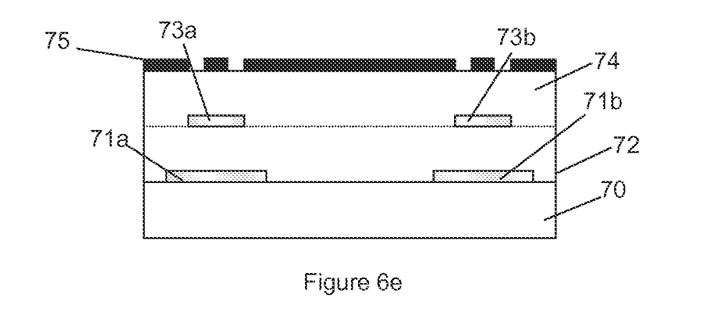
Figure 6F:
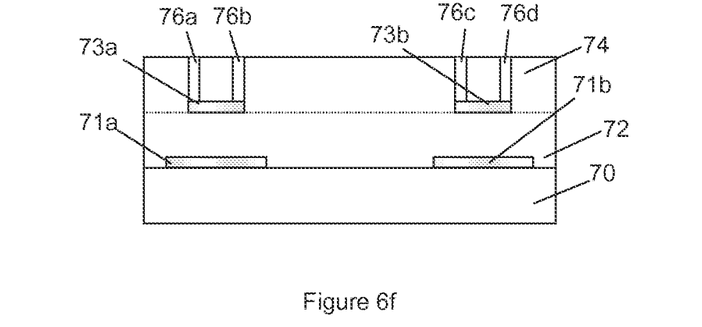

In FIG. 6e, a photoresist layer 75 is deposited to leave the pattern of the trenches required for the metal connectors of the inner, primary winding exposed for etching.

Anisotropic etching is then performed to form the trenches 76a to 76d and the photoresist layer 75 is subsequently removed. The trenches 76a to 76d can be seen in FIG. 6f.

Figure 6G:
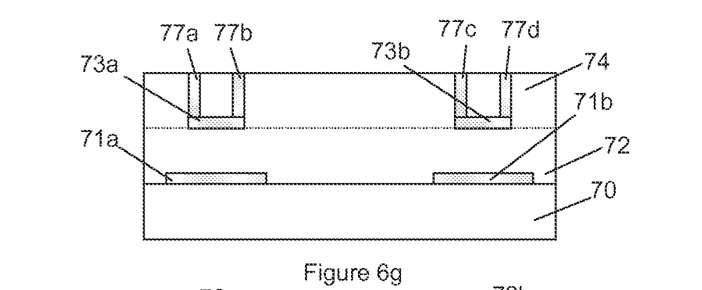

Copper metal is then used to fill the trenches 76a to 76d, which is achieved by chemical vapour deposition (CVD). This forms the metal connectors 77a to 77d for the primary winding, as seen in FIG. 6g. This is followed by a chemical mechanical polishing step for planarisation of the oxide layer 74 with metal connectors 77a to 77d embedded within.

Figure 6H:
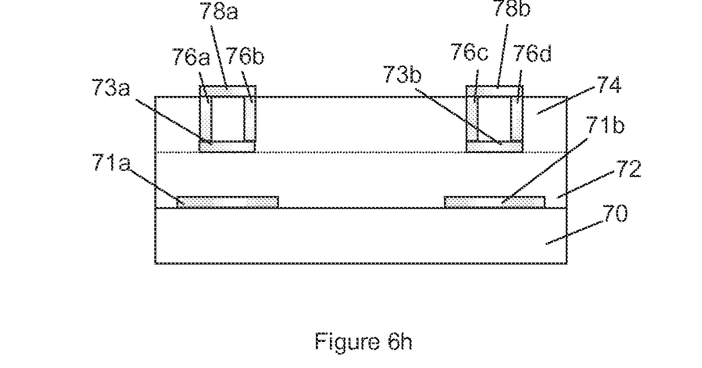

Copper is then deposited above the oxide layer 74 to form the top metal capping layers 78a, 78b for the primary winding in FIG. 6h.

Figure 6I:
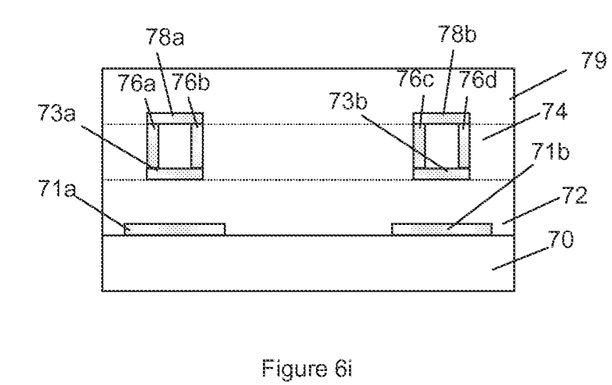

A third oxide layer 79 is then deposited above the oxide layer 74 and the top metal capping layers 78a, 78b of the primary winding in FIG. 6i. Chemical mechanical polishing (CMP) of the oxide layer 79 is then carried out for planarisation.

Figure 6J:
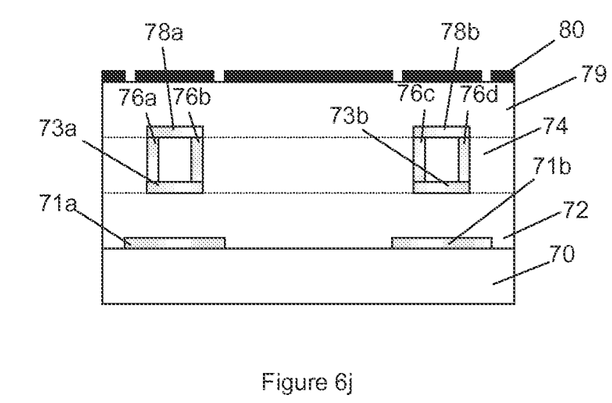
Figure 6K:
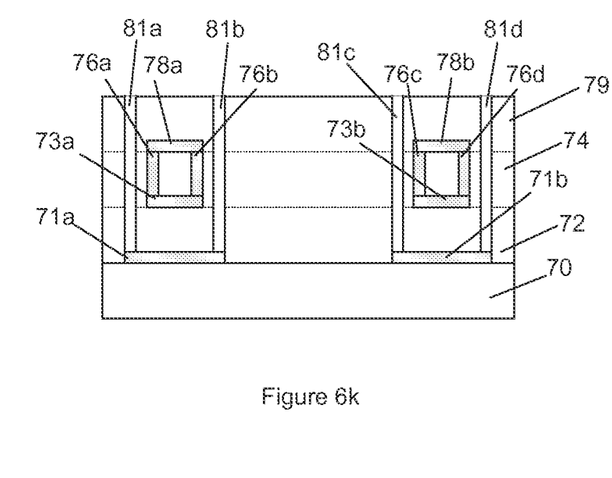

In FIG. 6j, a photoresist layer 80 is deposited to leave the pattern of the trenches required for the metal connectors of the outer, secondary winding exposed for etching.

Anisotropic etching is then performed to form the trenches 81a to 81d and the photoresist layer 80 is subsequently removed. The trenches 81a to 81d can be seen in FIG. 6k.

Figure 6L:
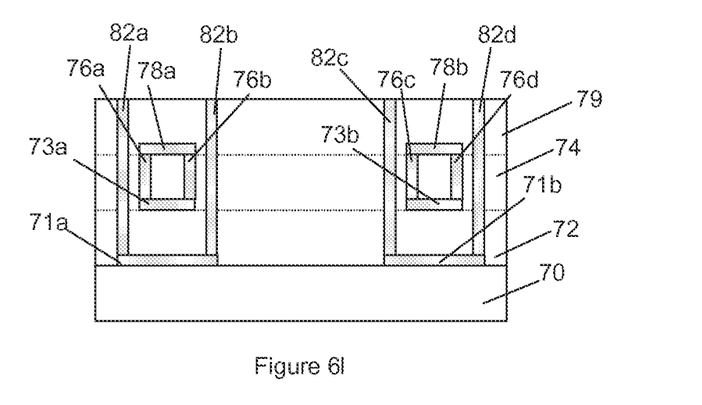

Copper metal is then used to fill the trenches 81a to 81d, which is achieved by chemical vapour deposition (CVD). This forms the metal connectors 82a to 82d for the secondary winding, as seen in FIG. 6l. This is followed by a chemical mechanical polishing step for planarisation of the oxide layer 79 with metal connectors 82a to 82d embedded within.

Figure 6M:
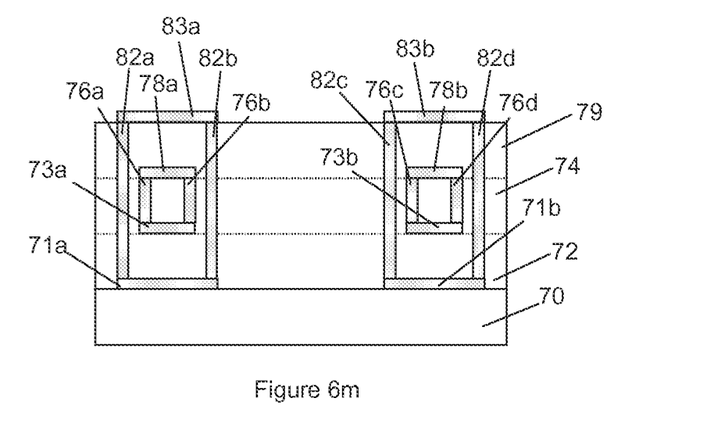

Copper is then deposited above the oxide layer 79 to form the top metal capping layers 83a, 83b in FIG. 6m. The resulting transformer, like that of FIG. 4, has a primary winding surrounded by the secondary winding.

Multiple primary windings may be provided within the secondary winding as in the transformers shown with reference to FIG. 4. In this case, where the trenches and deposition of metal are performed on oxide layers rather than on silicon, the FIG. 4b variant is most advantageous. This is because the bump interconnects are not required as the oxide layers can be formed contiguously without the need for plastic separators. Thus, if the oxide layer between windings is kept small enough the electromagnetic coupling coefficient can be made correspondingly high.

Figure 7A:
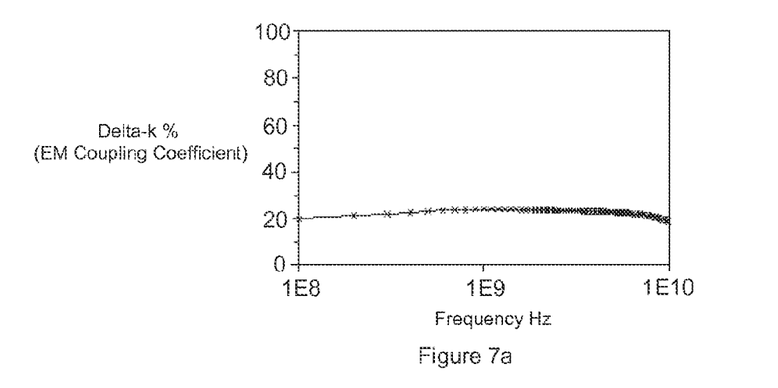
FIGS. 7a to 7c show graphically the improvement in electromagnetic coupling, quality factor and insertion loss provided by the transformer of FIG. 1.
Figure 7B:
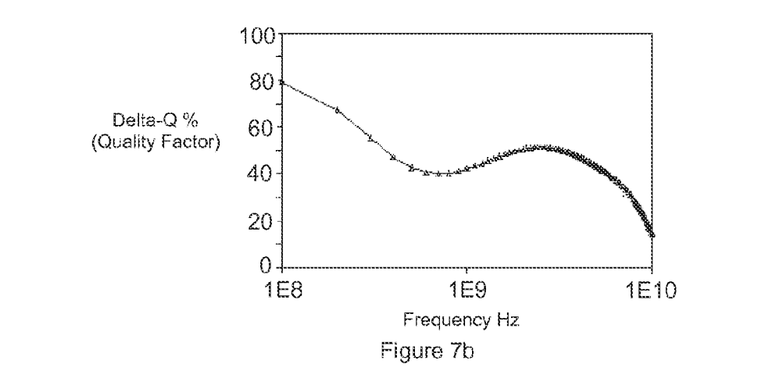
Figure 7C:
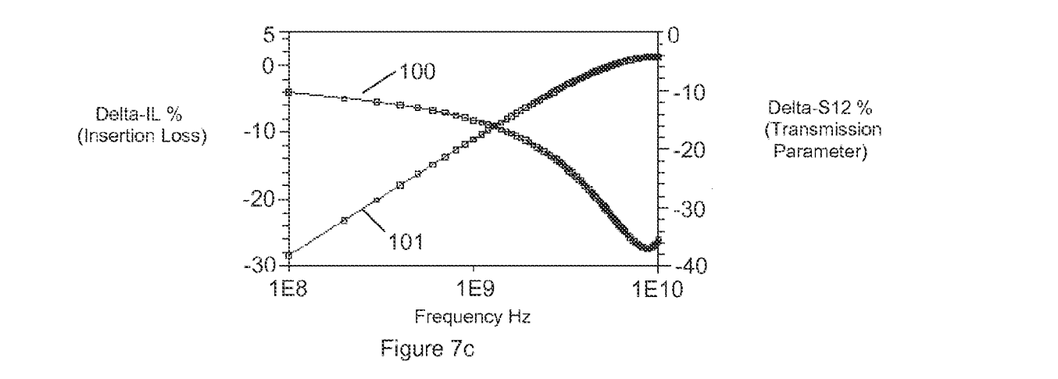

FIGS. 7a to 7c show the results of simulation carried out on a transformer with the same architecture as that of FIG. 1. The simulation results are presented as the difference between the absolute results for the architecture of FIG. 1 and the Shibata architecture, mentioned above.

In FIG. 7a, the difference in the electromagnetic coupling co-efficient, k, expressed as the percentage difference between the architecture of FIG. 1 and the Shibata architecture (i.e. the ratio of the difference in value between the two co-efficients to the co-efficient for the Shibata architecture multiplied by 100%) versus frequency is shown. As can be seen, there is a significant improvement with the architecture of FIG. 1.

FIG. 7b shows the difference in the quality factor for the primary winding, expressed as the percentage difference between the architecture of FIG. 1 and the Shibata architecture versus frequency. Again, there is a significant improvement with the architecture of FIG. 1.

FIG. 7c shows two plots of results. Plot 100 relates to the difference in insertion loss between the architecture of FIG. 1 and the Shibata architecture versus frequency. The values for the insertion loss are provided, as the percentage difference between the architecture of FIG. 1 and the Shibata architecture, by the y-axis on the left hand side of the graph. There is a marked decrease in insertion loss, especially around 10 GHz.

The second plot 101 relates to the difference in the transmission parameter S12 between the architecture of FIG. 1 and the Shibata architecture versus frequency. The values for S12 are provided, as the percentage difference between the architecture of FIG. 1 and the Shibata architecture, by the y-axis on the right hand side of the graph. There is a marked increase in S12, especially around 10 GHz.

It will be appreciated that although copper has been used as the metal to form the components of the transformers throughout, other metals such as aluminium or gold (or indeed, any other metal that is compatible with existing semiconductor fabrication processes) could be used. Similarly, different semiconductor materials than silicon could be used. For example, processes based on germanium, gallium arsenide, or silicon-germanium semiconductors could be used.

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. A method for manufacturing a transformer comprising primary and secondary windings, the method comprising, for each winding, providing first and second metal capping layers, and coupling the first and second metal capping layers together electrically in parallel by forming a metal connector passing through a substrate lying between the first and second metal capping layers.

2. A method according to claim 1, wherein, for each winding, the metal connector is formed by making first and second trenches through the substrate and depositing metal within the trenches to form a continuous layer from the top to the bottom surface of the substrate through the trench.

3. A method according to claim 2, wherein the first and second trenches are made using an anisotropic etching process.

4. A method according to claim 2, wherein the first and second trenches are made using a combination of an anisotropic etching process and grinding the substrate to reduce its thickness.

5. A method according to claim 2, wherein the metal is deposited within the trenches using a vapor deposition process or by electrolytic growth.

6. A method according to claim 1, wherein the metal capping layers are provided using a vapor deposition process or by electrolytic growth.

7. A method according to claim 5, wherein the substrate is a silicon substrate and prior to depositing metal within the trenches and/or providing the metal capping layers, an oxidation step is performed followed by silicon nitride deposition to isolate the metal from the silicon substrate.

8. A method according to claim 5, wherein physical vapor deposition of a titanium-copper alloy is performed to enable the electrolytic growth of copper.

9. The method of claim 1, wherein providing the first and second metal capping layers of the primary winding includes providing each of the metal capping layers of the primary winding as a continuous winding, with the metal connector forming the primary winding by connecting the continuous winding of the first metal capping layer with the continuous winding of the second metal capping layer.

10. The method of claim 9, wherein providing the first and second metal capping layers of the secondary winding includes providing each of the metal capping layers of the secondary winding as a continuous winding, with the metal connector of the secondary winding forming the secondary winding by connecting the continuous winding of the first metal capping layer with the continuous winding of the second metal capping layer.

11. The method of claim 1, further including providing the primary winding as two vertically stacked primary windings.

12. The method of claim 11, wherein providing the two vertically stacked primary windings includes providing the two vertically stacked primary windings in separate dies.

13. The method of claim 11, wherein providing the primary winding as two vertically stacked primary windings includes providing, for each of the two primary windings, the first and second metal capping layers of the winding as respective windings connected via the metal connector of the winding.

14. A method comprising:
forming a primary winding by forming a first metal capping layer winding, forming a second metal capping layer winding that winds in parallel with the first metal capping layer winding, and connecting the first and second metal capping layer windings by forming a first metal connector passing through a substrate between the first and second metal capping layer windings; and
forming a secondary winding by forming a third metal capping layer winding, forming a fourth metal capping layer winding that winds in parallel with the third metal capping layer winding, and connecting the third and fourth metal capping layer windings by forming a second metal connector passing through a substrate between the third and fourth metal capping layer windings.

15. The method of claim 14, wherein:

forming the first and third metal capping layer windings includes forming the windings on a first surface of the substrate; and forming the second and fourth metal capping layer windings includes forming the windings on a second surface of the substrate.

16. The method of claim 14, wherein forming the first and third metal capping layer windings includes forming the windings on a first surface of a substrate, further including forming the substrate on the first and third metal capping layer windings, wherein forming the first and second metal connectors include forming trenches in the substrate on the first and third metal capping layer windings and that expose the first and third metal capping layer windings, and filling the trench with a metal that forms the connectors, and forming the second and fourth metal capping layer windings includes forming the windings an upper surface of the substrate that is on the first and third metal capping layer windings and in contact with the connectors.

* * * * *